(12) United States Patent
Feix et al.

(10) Patent No.: US 12,224,379 B2
(45) Date of Patent: Feb. 11, 2025

(54) METHOD FOR PRODUCING OPTOELECTRONIC SEMICONDUCTOR CHIPS, AND OPTOELECTRONIC SEMICONDUCTOR CHIP

(71) Applicant: OSRAM Opto Semiconductors GmbH, Regensburg (DE)

(72) Inventors: Felix Feix, Jena (DE); Ines Pietzonka, Donaustauf (DE); Petrus Sundgren, Lappersdorf (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 330 days.

(21) Appl. No.: 17/765,657

(22) PCT Filed: Sep. 25, 2020

(86) PCT No.: PCT/EP2020/076869
§ 371 (c)(1),
(2) Date: Mar. 31, 2022

(87) PCT Pub. No.: WO2021/063819
PCT Pub. Date: Apr. 8, 2021

(65) Prior Publication Data
US 2022/0384680 A1    Dec. 1, 2022

(30) Foreign Application Priority Data
Oct. 1, 2019    (DE) .......................... 102019126506.1

(51) Int. Cl.
*H01L 33/30*    (2010.01)
*H01L 25/075*    (2006.01)
(Continued)

(52) U.S. Cl.
CPC .......... *H01L 33/30* (2013.01); *H01L 25/0753* (2013.01); *H01L 33/0062* (2013.01); *H01L 33/0093* (2020.05); *H01L 33/06* (2013.01)

(58) Field of Classification Search
CPC .................................................. H01L 33/0093
See application file for complete search history.

(56) References Cited

U.S. PATENT DOCUMENTS

| 5,023,199 A | 6/1991 | Murakami et al. |
| 5,556,804 A | 9/1996 | Nagai |
| (Continued) | | |

FOREIGN PATENT DOCUMENTS

| CN | 103875141 A | 6/2014 |
| DE | 4010133 A1 | 10/1990 |
| (Continued) | | |

OTHER PUBLICATIONS

Schubert, E., "Light-Emitting Diodes", 2nd Edition, 2006, Google Books, Jan. 1, 2006, 1 page.

*Primary Examiner* — Moazzam Hossain
*Assistant Examiner* — Hajar Kolahdouzan
(74) *Attorney, Agent, or Firm* — Slater Matsil, LLP

(57) ABSTRACT

In an embodiment a method for producing optoelectronic semiconductor chips includes A) growing an AlInGaAsP semiconductor layer sequence on a growth substrate along a growth direction, wherein the semiconductor layer sequence includes an active zone for radiation generation, and wherein the active zone is composed of a plurality of alternating quantum well layers and barrier layers, B) generating a structured masking layer, C) regionally intermixing the quantum well layers and the barrier layers by applying an intermixing auxiliary through openings of the masking layer into the active zone in at least one intermixing region and D) singulating the semiconductor layer sequence into sub-regions for the semiconductor chips, wherein the barrier (Continued)

layers in A) are grown from $[(Al_xGa_{1-x})_yIn_{1-y}]_zP_{1-z}$ with $x \geq 0.5$, and wherein the quantum well layers are grown in A) from $[(Al_aGa_{1-a})_bIn_{1-b}]_cP_{1-c}$ with $0 < a \leq 0.2$.

16 Claims, 5 Drawing Sheets

(51) Int. Cl.
*H01L 33/00* (2010.01)
*H01L 33/06* (2010.01)

(56) References Cited

U.S. PATENT DOCUMENTS

| | | |
|---|---|---|
| 8,823,024 B2 | 9/2014 | Engl et al. |
| 9,331,238 B2 | 5/2016 | Tangring et al. |
| 9,484,492 B2 | 11/2016 | Bour et al. |
| 10,396,241 B1 * | 8/2019 | Perkins ................ H01L 33/025 |
| 2008/0093593 A1 | 4/2008 | Ryu |
| 2011/0121259 A1 | 5/2011 | Han et al. |
| 2012/0248494 A1 | 10/2012 | Eberhard et al. |
| 2013/0020589 A1 | 1/2013 | Yu et al. |
| 2017/0170360 A1 | 6/2017 | Bour et al. |
| 2019/0280159 A1 | 9/2019 | Tonkikh et al. |

FOREIGN PATENT DOCUMENTS

| | | |
|---|---|---|
| JP | H11233817 A | 8/1999 |
| JP | 2001111105 A | 4/2001 |
| JP | 2014160854 A | 9/2014 |
| JP | 2018505567 A | 2/2018 |

\* cited by examiner

METHOD FOR PRODUCING OPTOELECTRONIC SEMICONDUCTOR CHIPS, AND OPTOELECTRONIC SEMICONDUCTOR CHIP

This patent application is a national phase filing under section 371 of PCT/EP2020/076869, filed Sep. 25, 2020, which claims the priority of German patent application 102019126506.1, filed Oct. 1, 2019, each of which is incorporated herein by reference in its entirety.

TECHNICAL FIELD

A method for producing optoelectronic semiconductor chips is specified. Furthermore, an optoelectronic semiconductor chip is specified.

SUMMARY

Embodiments provide a method for producing relatively small optoelectronic semiconductor chips with a high efficiency.

According to at least one embodiment, the method is used for producing optoelectronic semiconductor chips. The finished semiconductor chips are in particular light-emitting diode chips, in short LED chips. Alternatively, laser diode chips can be produced, for example surface-emitting laser diode chips or also edge-emitting laser diode chips. Furthermore, it is possible that the optoelectronic semiconductor chips are detector chips, in particular photodiodes.

According to at least one embodiment, the method comprises the step of growing a semiconductor layer sequence. In particular, the semiconductor layer sequence is grown on a growth substrate along a growth direction. The growth substrate is in particular a GaAs substrate.

The semiconductor layer sequence is preferably based on a III-V compound semiconductor material. Particularly preferably, the semiconductor layer sequence is based on the phosphide material system AlInGaAsP. In this case, the semiconductor layer sequence comprises Al as well as In, Ga and P. As forms an optional component of the semiconductor layer sequence. At the same time, the semiconductor layer sequence may comprise dopants as well as additional components. However, for simplicity, only the essential constituents of the crystal lattice of the semiconductor layer sequence, that is Al, As, Ga, In, or P, are specified, even though these may be partially replaced and/or supplemented by small amounts of additional substances.

Alternatively to AlInGaAsP or AlInGaP, the semiconductor layer sequence can also be based on AlInGaN or AlInGaAs. The following explanations for AlInGaAsP or AlInGaP may apply accordingly to AlInGaN or AlInGaAs, wherein N or As is to be substituted for P, respectively.

According to at least one embodiment, the semiconductor layer sequence comprises an active zone. The active zone is preferably configured for radiation generation, but may alternatively be configured for radiation detection. The active zone is in particular a multi-quantum well structure, MQW for short. In the active zone, quantum well layers and barrier layers are arranged alternately. In particular, the active zone consists of the alternately arranged quantum well layers and barrier layers.

According to at least one embodiment, the method comprises the step of generating a patterned masking layer. The masking layer may be a part of the semiconductor layer sequence and may thus still be present in the finished semiconductor chips. Alternatively, the masking layer is a layer specifically fabricated for this purpose, for example a soft mask such as a photoresist layer or a hard mask such as an oxide layer.

According to at least one embodiment, the method comprises the step of regionally intermixing the quantum well layers and the barrier layers. The intermixing is performed by means of applying an intermixing auxiliary. The intermixing auxiliary, in particular zinc, is introduced into the active zone through openings in the masking layer so that the intermixing auxiliary is located in at least one intermixing region. The intermixing auxiliary induces intermixing of crystal components of the semiconductor layer sequence, in particular of Al, Ga and/or In. During intermixing, the temperature is preferably significantly above room temperature and also a later intended operating temperature of the finished semiconductor chips.

The intermixing can be carried out homogeneously over all quantum well layers. Alternatively, the intermixing is performed inhomogeneously. The intermixing region preferably extends completely through the active zone into an n-doped region. Although there is preferably only one intermixing region per active zone or per side flank of an active zone, there may also be several intermixing regions per active zone or per side flank, which may be interrupted along the growth direction by an unmixed region.

According to at least one embodiment, the method comprises the step of separating the semiconductor layer sequence into sub-regions for the semiconductor chips. The singulation is performed, for example, by means of etching, but may alternatively be performed by means of sawing or scribing and breaking.

According to at least one embodiment, the barrier layers are grown from $[(Al_xGa_{1-x})_yIn_{1-y}]_zP_{1-z}$. Preferably, $x \geq 0.5$ or $x \geq 0.6$ or $x \geq 0.7$ or $x \geq 0.8$ or $x \geq 0.9$ applies. It is possible that $x=1$ applies and thus the barrier layers, as grown, are free or substantially free of Ga.

In at least one embodiment, the method serves for producing optoelectronic semiconductor chips and comprises the following steps, particularly preferably in the order given:

A) growing an AlInGaAsP semiconductor layer sequence on a growth substrate along a growth direction, wherein the semiconductor layer sequence comprises an active zone for radiation generation and the active zone is composed of a plurality of alternating quantum well layers and barrier layers, B) generating a patterned masking layer, C) regionally intermixing the quantum well layers and the barrier layers by applying an intermixing auxiliary through openings of the masking layer into the active zone in at least one intermixing region, and D) separating the semiconductor layer sequence into sub-regions for the semiconductor chips, wherein the barrier layers in step A) are grown from $[(Al_xGa_{1-x})_yIn_{1-y}]_zP_{1-z}$ with $x \geq 0.5$ or, preferably, with $x \geq 0.6$.

With the method described herein, it is possible, especially for LED chips with small edge lengths on lateral surfaces of the semiconductor layer sequence, to reduce or eliminate in particular a non-radiating charge carrier recombination and thus a loss channel. Thus, semiconductor chips with small lateral dimensions and with a high efficiency can be produced.

A local diffusion of impurities and a subsequent intermixing of quantum wells, also referred to as quantum well intermixing, is a possible method to specifically improve a small current behavior of optoelectronic semiconductor chips. This applies in particular to light emitting diode chips with small dimensions, also referred to as μLEDs, especially with emission in the red spectral range. Sufficiently long diffusion times must be maintained, in particular in a MOVPE reactor, to achieve a significant extent of intermixing on a wafer with densely packed μLEDs.

However, the extent of intermixing depends not only on the diffusion time, but also on a packing factor of the μLEDs. Thereby, the extent of intermixing tends to decrease as the packing factor increases. With the method described herein, it is possible to reduce a time cost during producing, in particular the diffusion time, and/or to achieve an increased extent of intermixing in the active zone for μLEDs densely packed on a wafer, in particular red emitting μLEDs.

Local diffusion of impurities, such as zinc, in combination with intermixing of the quantum wells and the barrier layers induced by the impurities is done, for example, to improve efficiency in μLEDs based on the AlInGaAsP material system. In common LED structures, the barrier layers comprise an aluminum content, expressed by the variable x in $[(Al_xGa_{1-x})_yIn_{1-y}]_zP_{1-z}$, of about 50%. The reason for such a comparatively low aluminum content is that a cutoff voltage usually increases with a higher aluminum content, especially for active zones with several 10 barrier layers and quantum well layers. In the method described herein, on the other hand, barrier layers are grown with a significantly higher aluminum content of at least 60%, preferably at least 80%.

For AlGaInP-based μLEDs, a number of quantum well layers and barrier layers in the active zone is usually limited to a maximum of 50. Nevertheless, current injection into the active zone has to be homogeneous across the quantum well layers. If an intermixing step is used, a design of the layers in the active zone must be carefully chosen. Typical potential barriers to avoid recombination centers for non-radiative recombination of charge carriers at sidewalls of a μLED and thus to avoid efficiency degradation as well are around 65 meV for barriers with an aluminum content x of 50%. This value is around 140 meV for barrier layers with an aluminum content x of 85%.

This applies to same process times. That is, the same process time results in increased intermixing due to the higher aluminum content and thus in improved efficiency of the finished semiconductor chips. In addition, intermixing is generally difficult in the manufacturing process of μLEDs, so intermixing in such μLEDs can generally be improved with the method described herein. In addition, an intermixing region created with barriers having a high aluminum content x comprises a band gap with an indirect transition. That is, not only radiative recombination but also non-radiative recombination in the intermixing region with the intermixing auxiliary can be significantly reduced, thereby increasing an efficiency of the finished light-emitting diodes.

Furthermore, with the method described herein it is possible, especially for μLEDs, to influence a homogeneity of the current imprint in the quantum well layers by varying the design of the barrier layers along the growth direction across the active zone.

According to at least one embodiment, the masking layer is formed by a contact layer, in particular by a p-contact layer, of the semiconductor layer sequence. Alternatively, a separate masking layer, for example in the form of a suitably structured permanent passivation layer or in the form of a temporary layer, such as a photoresist layer, is used.

According to at least one embodiment, the contact layer, especially the p-contact layer, is completely penetrated by the openings in step B). That is, in places the contact layer is completely removed.

In this process, the contact layer preferably comprises $Al_vGa_{1-v}As$ or consists thereof. In particular, $v \leq 0.35$ or $v \leq 0.1$ applies. Alternatively or additionally, $v \geq 0$ applies, in particular $v \geq 0.01$ or $v \geq 0.05$. The contact layer can also be a combination of GaAs layers and of such AlGaAs layers.

According to at least one embodiment, the intermixing in step C) is performed along the growth direction completely through the active zone. That is, the intermixing region completely penetrates the active zone towards the growth substrate. Alternatively, the intermixing region extends through the active zone, but does not reach or only partially reaches the growth substrate.

According to at least one embodiment, the singulation in step D) takes place only in the at least one intermixing region. This applies in particular as seen in top view of the semiconductor layer sequence, in particular as seen in top view of the contact layer. Side surfaces of the semiconductor layer sequence, which are formed during the singulation, are thus at least partially or also completely formed by the at least one intermixing region.

According to at least one embodiment, the quantum well layers in step A) are grown from $[(Al_aGa_{1-a})_bIn_{1-b}]_cP_{1-c}$. In particular, $0 < a \leq 0.3$ or $0.05 \leq a \leq 0.2$ applies. An emission wavelength of maximum intensity of the active zone can be set via the aluminum content in the quantum well layers. It is possible that all quantum well layers are grown nominally the same, i.e. do not differ from each other within the manufacturing tolerances with respect to their material composition and also with respect to their thickness. Alternatively, it is possible that quantum well layers with different compositions are grown so that, for example, a thickness gradient or a gradient in the aluminum content of the quantum well layers is achieved along the growth direction in the active zone. Such quantum well layers with varying properties are also referred to as chirped MQW.

According to at least one embodiment, $0.47 \leq y \leq 0.53$ as well as $0.47 \leq z \leq 0.53$ and/or $0.47 \leq b \leq 0.53$ as well as $0.47 \leq c \leq 0.53$ or also $0.48 \leq y \leq 0.52$ and $0.48 \leq z \leq 0.52$ and/or $0.48 \leq b \leq 0.52$ as well as $0.48 \leq c \leq 0.52$ applies for the quantum well layers of $[(Al_aGa_{1-a})_bIn_{1-b}]_cP_{1-c}$ and for the barrier layers of $[(Al_xGa_{1-x})_yIn_{1-y}]_zP_{1-z}$. Preferably, $c < 0.5$ and $z < 0.5$ and/or $b > 0.5$ and $y > 0.5$ applies.

The aforementioned values for b, c, y and z apply in particular in the case of lattice-matched or quasi-lattice-matched growth of the semiconductor layer sequence on a GaAs growth substrate. Alternatively, the active zone can be grown in a purposefully strained manner such that different values for y, z and/or for b, c are purposefully used from the above-mentioned regions.

According to at least one embodiment, step C) includes a temperature treatment of the semiconductor layer sequence. For example, an elevated temperature is present for a time period of at least 0.2 hours or 0.5 hours and/or at most 10 hours or 2 hours. For example, the elevated temperature is at least 400° C. or 500° C. and/or at most 700° C. or 600° C. In particular, this temperature is between 500° C. and 540° C., inclusive.

According to at least one embodiment, the active zone is located between a first semiconductor region and a second semiconductor region. The first and/or the second semiconductor region may each be composed of one or more sub-layers. In particular, the second semiconductor region comprises a plurality of sub-layers. For example, the first semiconductor region is n-doped and the second semiconductor region is p-doped. In this case, the p-contact layer can be the sub-layer of the second semiconductor region that is furthest away from the active zone after step A).

According to at least one embodiment, the openings extend at least 50 nm or at least 100 nm through the contact layer in the direction towards the active zone into the remaining second semiconductor region. Thereby, these openings end at a distance from the active zone. This distance to the active zone is preferably at least 150 nm or 250 nm or 300 nm. A total thickness of the second semiconductor region is in particular at least 0.3 µm or 0.4 µm. Alternatively or additionally, the total thickness may be at most 10 µm or 1 µm or 0.6 µm, for example. Thereby, the p-contact layer preferably comprises only a relatively small thickness, for example a thickness of at most 50 nm or 20 nm and/or of at least 4 nm or 8 nm.

According to at least one embodiment, the sub-regions of the semiconductor layer sequence for the semiconductor chips generated in step D) each comprise an average edge length of at most 150 µm or 100 µm or 70 µm or 30 µm or 10 µm, as seen in top view. Thus, the finished semiconductor chips are µLEDs. If the sub-regions are not square or rectangular when viewed from above, an average diameter of the sub-regions can be substituted for the average edge length.

According to at least one embodiment, the at least one intermixing region after step D) extends in the direction perpendicular to the growth direction at least 0.1 µm or 0.2 µm into the active zone. Alternatively or additionally, this value is at most 1.5 µm or 1 µm or 0.5 µm or 0.3 µm. This means that only a comparatively small proportion of the active zone, seen in top view, is intermixed. That is, seen in top view, the intermixing region is comparatively small relative to the active zone and in particular is at most 3% or 1% or 0.2% of the area of the active zone, again seen in top view.

According to at least one embodiment, the at least one intermixing region extends completely through the semiconductor layer sequence in a direction parallel to the growth direction. That is, the intermixing region may extend up to the growth substrate or even into the growth substrate.

According to at least one embodiment, the active zone after step A) comprises at least 2 or 3 or 4 of the quantum well layers. Alternatively or additionally, the number of quantum well layers is at most 50 or 30 or 20 or 10 or 5.

According to at least one embodiment, the quantum well layers each have a thickness of at least 2 nm or 4 nm. Alternatively or additionally, the thicknesses of the quantum well layers are each at most 15 nm or 10 nm or 7 nm or 4 nm.

According to at least one embodiment, the barrier layers each comprise a thickness of at least 2 nm or 3 nm or 5 nm. Alternatively or additionally, the thickness of the barrier layers is each at most 353 nm or 25 nm or 15 nm or 10 nm. In particular, the thickness of the barrier layers is 7 nm, for example with a tolerance of at most 1 nm or 2 nm.

According to at least one embodiment, the active zone is configured to generate an emission wavelength of maximum intensity of at least 560 nm or 590 nm or 610 nm or 620 nm. Alternatively or additionally, the emission wavelength of maximum intensity is at most 670 nm or 655 nm or 635 nm. That is, the finished semiconductor chips are configured in particular to generate red light.

According to at least one embodiment, the barrier layers are grown such that some or all barrier layers comprise different aluminum contents after step A) and at least still before step C). Blocks of immediately successive barrier layers may nominally been grown the same. It is possible for the barrier layers to comprise aluminum contents that differ from one another in pairs.

According to at least one embodiment, after step A) and before step C), the respective aluminum content is constant within the respective barrier layer. That is, the individual barrier layers are then grown, each seen within the respective barrier layer, without gradients in aluminum content. Alternatively, the individual barrier layers can already be grown with an aluminum gradient in step A).

According to at least one embodiment, a minimum and a maximum aluminum content of the barrier layers in the active zone after step A) and until at least before step C) differ by at least a factor of 1.05 or 1.1 or 1.2. Alternatively or additionally, this factor is at most 1.7 or 1.6 or 1.5 or 1.4.

According to at least one embodiment, some or all of the barrier layers comprise thicknesses that differ from one another. Thereby, barrier layers of the same thickness may be comprised in blocks or all barrier layers may comprise thicknesses that differ from one another in pairs.

According to at least one embodiment, a minimum and a maximum thickness of the barrier layers in the active zone differ by at least a factor of 1.2 or 1.5 or 2 or 2.5. Alternatively or additionally, this factor is at most 8 or 6 or 4 or 3.

According to at least one embodiment, the barrier layers in the active zone are arranged asymmetrically with respect to a thickness variation and/or an aluminum content variation at least after step A) until before step C). That is, in the active zone, there is no symmetry plane oriented perpendicular to the growth direction with respect to a design of the barrier layers. Alternatively, the barrier layers are symmetrically distributed, so that such a symmetry plane exists in the active zone with respect to the barrier layers.

According to at least one embodiment, the intermixing auxiliary is zinc. The zinc is applied in step C), in particular by means of vapor deposition, for example in the form of diethylzinc, DEZn for short, or as dimethylzinc, DMZn for short. Alternatively or in addition to zinc, magnesium can be used, which is applied, for example, by means of bis (cyclopentadienyl)-magnesium, Cp2Mg for short.

According to at least one embodiment, after step D), in a step E), at least one passivation layer is applied to the cut through intermixing regions, i.e. to side surfaces of the semiconductor layer sequence produced in the singulation process. The passivation layer is, for example, made of an oxide such as silicon dioxide or a nitride such as silicon nitride. A thickness of the passivation layer is preferably relatively small and is, for example, at least 50 nm and/or at most 250 nm.

According to at least one embodiment, the growth substrate is removed after step C), either immediately after step C) or only after further intermediate steps. In particular, a replacement carrier may be attached to the semiconductor layer sequence prior to removal of the growth substrate. Such a replacement carrier is preferably attached before the singulation in step D). The singulation, i.e. step D), can be performed before or after the removal of the growth substrate, depending on when the optional replacement carrier is attached.

Furthermore, an optoelectronic semiconductor chip is specified. The semiconductor chip is preferably produced by a method as described in connection with one or more of the above embodiments. Features of the semiconductor chip are therefore also disclosed for the method, and vice versa.

In at least one embodiment, the optoelectronic semiconductor chip comprises an AlInGaAsP semiconductor layer sequence, wherein the semiconductor layer sequence comprises an active zone for radiation generation and the active zone is composed of a plurality of alternating quantum well layers and barrier layers. The semiconductor layer sequence comprises a patterned masking layer, in particular the p-contact layer. The quantum well layers and the barrier layers are regionally intermixed in the active zone in an intermixing region, and an intermixing auxiliary, in particular zinc, is present in the intermixing region. The intermixing region, as seen in top view, preferably extends in a closed path all around the semiconductor layer sequence. Outside the intermixing region, the barrier layers are of $[(Al_xGa_{1-x})_yIn_{1-y}]_zP_{1-z}$ with x≥0.5 or x≥0.8 or x≥0.9 or x=1.

According to at least one embodiment, the semiconductor chips are red-emitting light-emitting diode chips with an average edge length of at most 50 μm. The intermixing region extends in the direction perpendicular to a growth direction of the semiconductor layer sequence at least 0.1 μm and/or at most 0.5 μm into the active zone.

BRIEF DESCRIPTION OF THE DRAWINGS

In the following, a method described herein and an optoelectronic semiconductor chip described herein are explained in more detail with reference to the drawing by means of exemplary embodiments. Identical reference signs specify identical elements in the individual figures. However, no scale references are shown, rather individual elements may be shown exaggeratedly large for better understanding.

DETAILED DESCRIPTION OF ILLUSTRATIVE EMBODIMENTS

Figure 1:
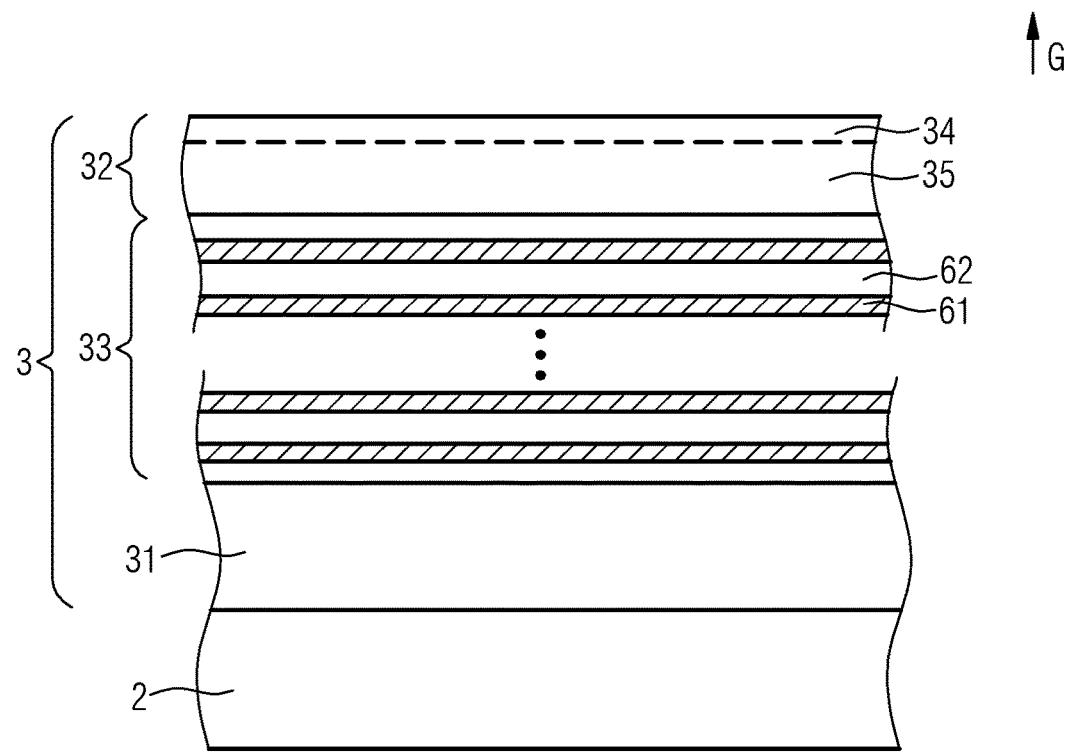
FIGS. 1-5 show schematic sectional views of method steps of an exemplary embodiment of a production process for optoelectronic semiconductor chips described herein.

FIGS. 1 to 5 illustrate an exemplary embodiment of a production process for optoelectronic semiconductor chips 1. According to FIG. 1, a semiconductor layer sequence 3 is epitaxially grown along a growth direction G on a growth substrate 2.

The semiconductor layer sequence 3 comprises a first semiconductor region 31, for example an n-doped region, directly on the growth substrate 2. In the figures, the first semiconductor region 31 is drawn as only one layer in each case. Deviating from this, the first semiconductor region 31 may be composed of several sub-layers. In particular, the first semiconductor region 31 towards the growth substrate 2 comprises an undrawn buffer layer and/or an undrawn n-contact layer.

In the direction away from the growth substrate 2, the first semiconductor region 31 is followed by an active zone 33 for generating radiation. The active zone 33 includes a plurality of quantum well layers 61 and barrier layers 62 arranged alternately. In particular, orange or red light is generated in the active zone 33 during operation of the finished semiconductor chips 1.

Along the growth direction G, the active zone 33 is followed by a second semiconductor region 32. The second semiconductor region 32 is, for example, p-doped. As the uppermost layer farthest from the growth substrate 2, the second semiconductor region 32 comprises a p-contact layer 34. Thus, a remaining second semiconductor region 35 is located between the p-contact layer 34 and the active zone 33.

The semiconductor layer sequence 3 is based on the material system AlGaInAsP. Thereby, the quantum well layers are preferably made of $[(Al_aGa_{1-a})_bIn_{1-b}]_cP_{1-c}$ with 0.1≤a≤0.3, depending on the wavelength to be generated. The barrier layers are composed of $[(Al_xGa_{1-x})_yIn_{1-y}]_zP_{1-z}$ with x≥0.6, in particular x≥0.8. Thus, the barrier layers comprise a relatively high aluminum content x. In particular, the p-contact layer 34 is made of $Al_vGa_{1-v}As$ with v≤0.2. For the parameters b, c, y and z, it is particularly that these parameters are around 0.5, specifically at 0.51 and 0.49, respectively. For example, the active zone 33 comprises between and including 5 and 15 of the quantum well layers 62.

Figure 2:
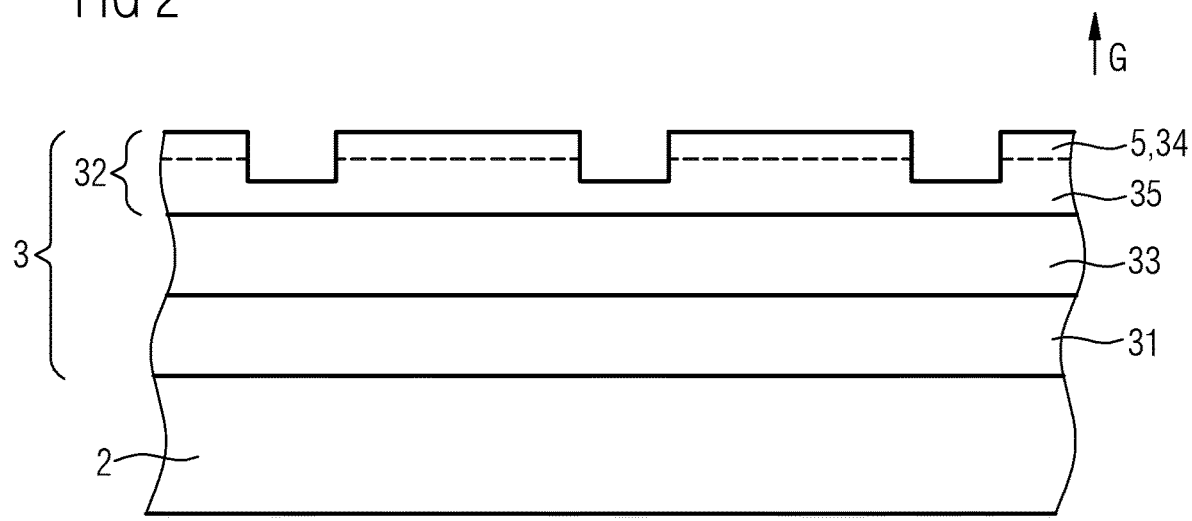

In the method step of FIG. 2, it is shown that a plurality of openings 50 are created through the p-contact layer 34. The openings 50 extend into the remaining second semiconductor region 35. For example, a depth of the openings 50 is between 50 nm and 200 nm, inclusive. A distance between the openings 50 and the active zone 33 is preferably at least 300 nm. The remaining second semiconductor region 35 comprises, for example, a thickness between 300 nm and 600 nm, inclusive. A thickness of the p-contact layer 34 is, for example, between 5 nm and 20 nm, inclusive.

Figure 3:
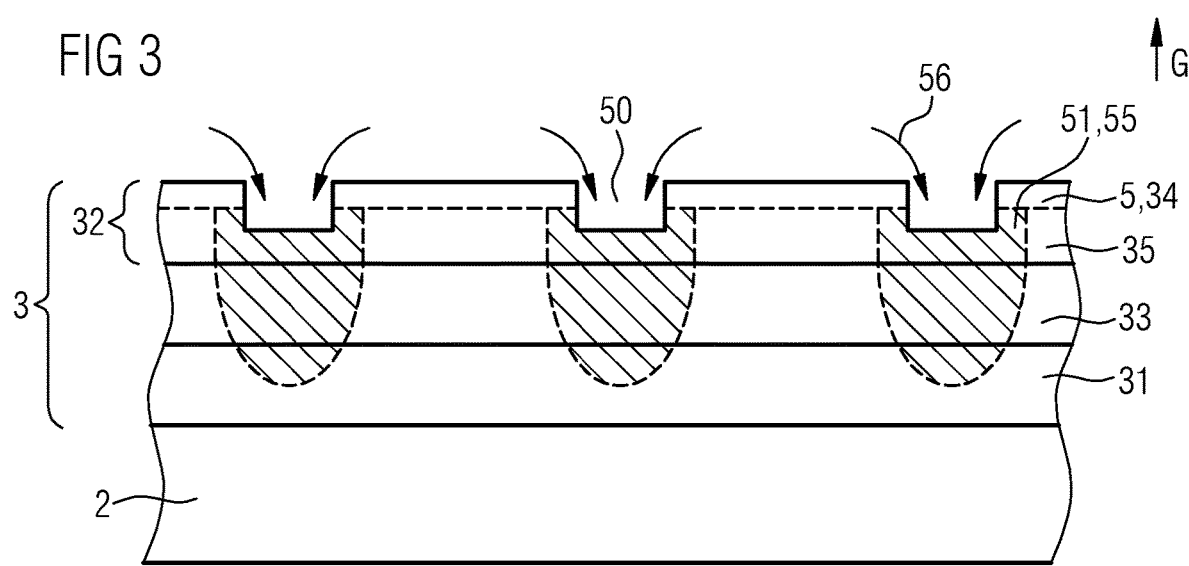

Thus, the p-contact layer 34 simultaneously serves as a masking layer 5 for a subsequent process step, see FIG. 3. Optionally, in the steps of FIGS. 2 and 3, a further masking layer, for example a photoresist layer, which is not shown, is applied next to the openings on the p-contact layer 34. However, such a further masking layer, with which the openings 50 are created in the p-contact layer 34, can also be removed before the method step of FIG. 3.

In FIG. 3, it is illustrated that a gaseous precursor 56 is introduced to the semiconductor layer sequence 3. The precursor 56 is, for example, DMZn or DEZn. Thus, zinc is provided via the precursor 56 as an intermixing auxiliary 55. As an alternative to providing it from the gas phase, a solid layer for the intermixing auxiliary 55 can also be deposited, for example a zinc layer a few nm thick.

Preferably at an elevated temperature of, for example, about 550° C., the intermixing auxiliary 55 diffuses into the semiconductor layer sequence 3. In this case, the AlGaAs p-contact layer 34 is nontransmissive to the intermixing auxiliary 55.

Thus, intermixing regions 51 in which the intermixing auxiliary 55 is present are formed at the openings 50, respectively. In the intermixing regions 51, intermixing of the materials of the barrier layers 62 and the quantum well layers 61 occurs. This is illustrated further below in connection with FIGS. 11 to 14.

The intermixing regions 51 extend, for example, to at least 0.2 μm or 0.5 μm below the p-contact layer 34. The same may apply to all other exemplary embodiments.

Figure 4:
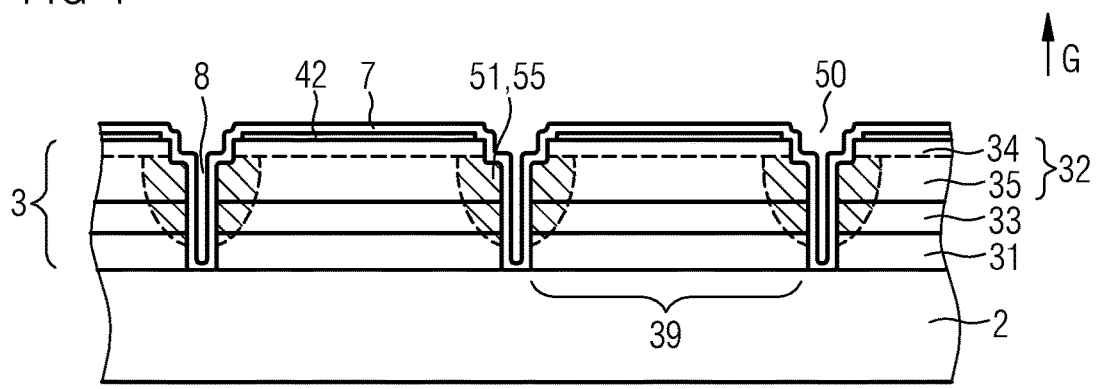

In the method step shown in FIG. 4, it is illustrated that the semiconductor layer sequence 3 is separated in the region of the openings 50 to form sub-regions 39 for the semiconductor chips 1. This singulation is carried out, for example, by means of etching. Thus, singulation trenches 8 are formed between the sub-regions 39. Deviating from the illustration in FIG. 4, the singulation trenches 8 can also extend into the growth substrate 2. An edge length of the sub-regions 39, seen in top view, is preferably small and lies below 100 μm or 50 μm.

The singulation trenches 8 are each located in the region of the intermixing regions 51. The singulation trenches 8 result in sidewalls of the semiconductor layer sequence 3 which, according to FIG. 4, are each formed only partially by the intermixing regions 51. In the direction towards the growth substrate 2, the intermixing regions 51 start at a side of the p-contact layer 34 facing the active zone 33. Preferably, the intermixing regions 51 extend under the p-contact layer 34 as drawn.

Also illustrated in FIG. 4 is that a plurality of second electrodes 42 are applied to the p-contact layer 34 as well as that a passivation layer 7 is formed. Masking layers for generating the second electrode 42 and/or for generating the passivation layer 7 are not drawn.

Figure 5:
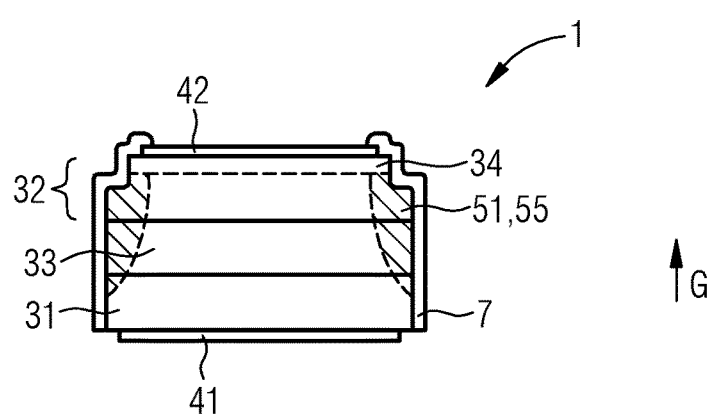

In FIG. 5, it is further illustrated as an option that the growth substrate is removed from the sub-regions. A first electrode 41 is attached to the first semiconductor region 31. The passivation layer 7 is largely removed from the second electrode 42. Thus, the semiconductor chip 1 is preferably a light emitting diode chip for generating red light.

The electrodes 41, 42 are only schematically indicated in FIG. 5. The electrodes 41, 42, which comprise at least a metal and/or a transparent conductive oxide, are designed, for example, as described in FIG. 3 and in paragraphs 59 to 62 of the document US 2012/0248494 A1. The disclosure content of this document, in particular FIG. 3 and paragraphs 59 to 62, is incorporated by reference.

Figure 6:
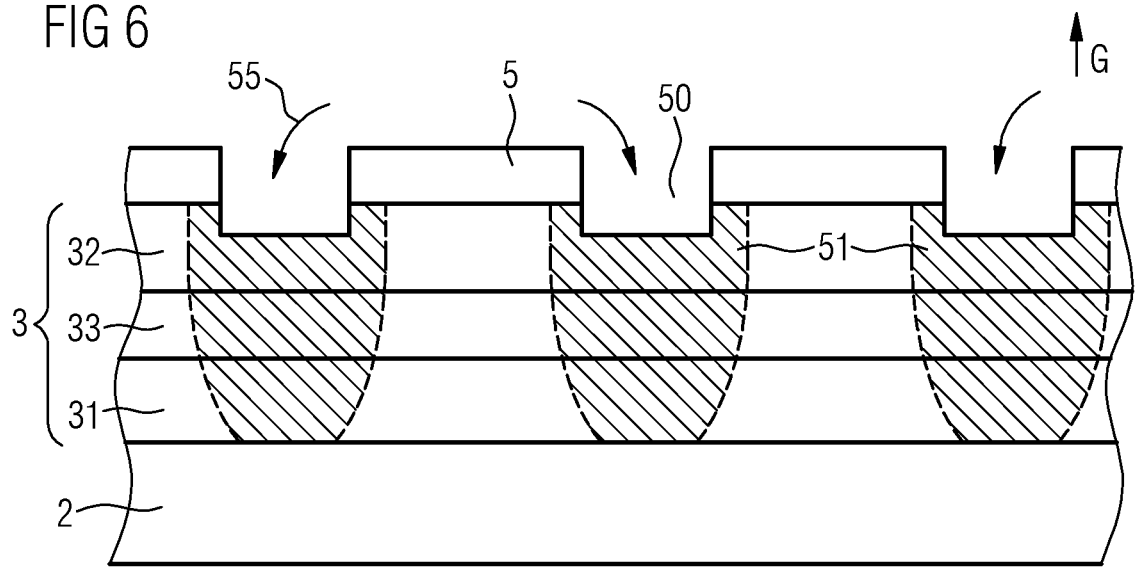
FIGS. 6 and 7 show schematic sectional views of method steps of an exemplary embodiment of a production process described herein for optoelectronic semiconductor chips described herein.
Figure 7:
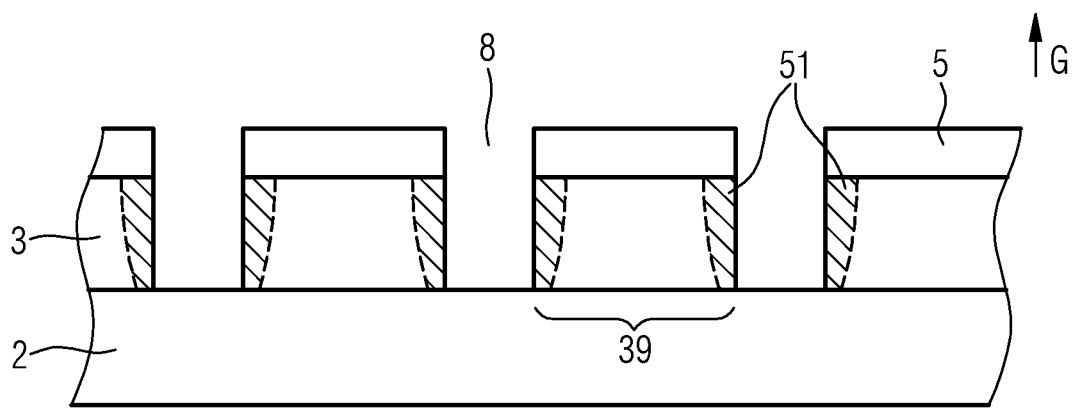

FIGS. 6 and 7 show a further production process, wherein only some method steps are illustrated. The remaining method steps can be carried out in the same way as in FIGS. 1 to 5.

According to FIG. 6, the intermixing auxiliary 55 is applied through the openings 50 and the intermixing regions 51 are created. Thereby, a separate masking layer 5, which is not a sub-layer of the semiconductor layer sequence 3, is used. For example, the masking layer 5 is a hard mask, for example of silicon nitride or of silicon dioxide. With this, the intermixing regions 51 may extend to the masking layer 5.

Furthermore, it is shown in FIG. 6 that the intermixing regions 51 completely penetrate the semiconductor layer sequence 3 and thus extend to the growth substrate 2. A corresponding design of the intermixing regions 51 is also possible in the method of FIGS. 1 to 5.

According to FIG. 7, the singulation trenches 8 are created which extend at least as far as the growth substrate 2. Thus, sidewalls of the semiconductor layer sequence 3 and thus of the singulation trenches 8 can be completely formed by the intermixing regions 51 in regions below the masking layer 5.

It is possible that the masking layer 5 also serves as a mask for creating the singulation trenches 8. That is, the singulation trenches 8 and the openings 50 may extend congruently with one another as seen in top view, in deviation from the illustration in FIGS. 1 to 5. Corresponding singulation trenches 8 may alternatively also be used in the method as illustrated in connection with FIGS. 1 to 5.

Figure 8:
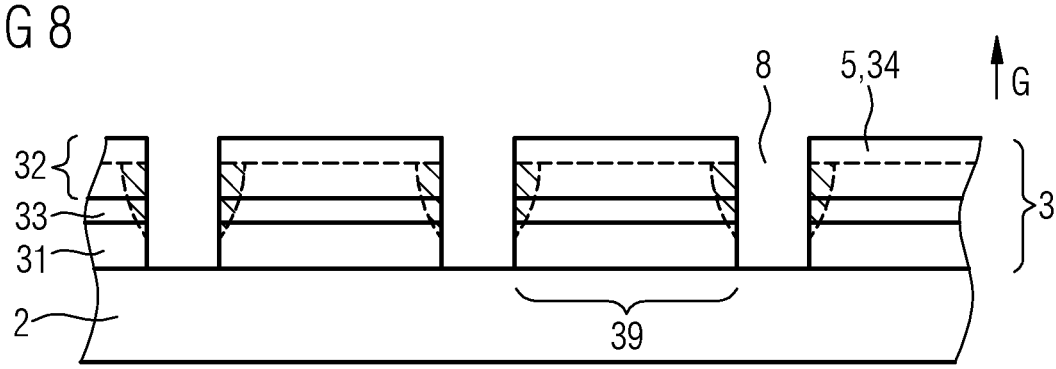
FIG. 8 shows a schematic sectional view of a method step of an exemplary embodiment of a production process for optoelectronic semiconductor chips described herein.

In the method of FIG. 8, it is illustrated that again the p-contact layer 34 serves as masking layer 5. In this case, too, the singulation trenches 8 and the openings 50 are arranged congruently as seen in top view. However, it is not absolutely necessary that the intermixing regions 51 affected by singulation still extend to the growth substrate 2 after singulation. For example, the intermixing regions 51 extend only into regions up to the growth substrate 2 that are subsequently removed by the singulation. A corresponding arrangement is also possible in the methods of FIGS. 1 to 5 and FIGS. 6 and 7.

Figure 9:
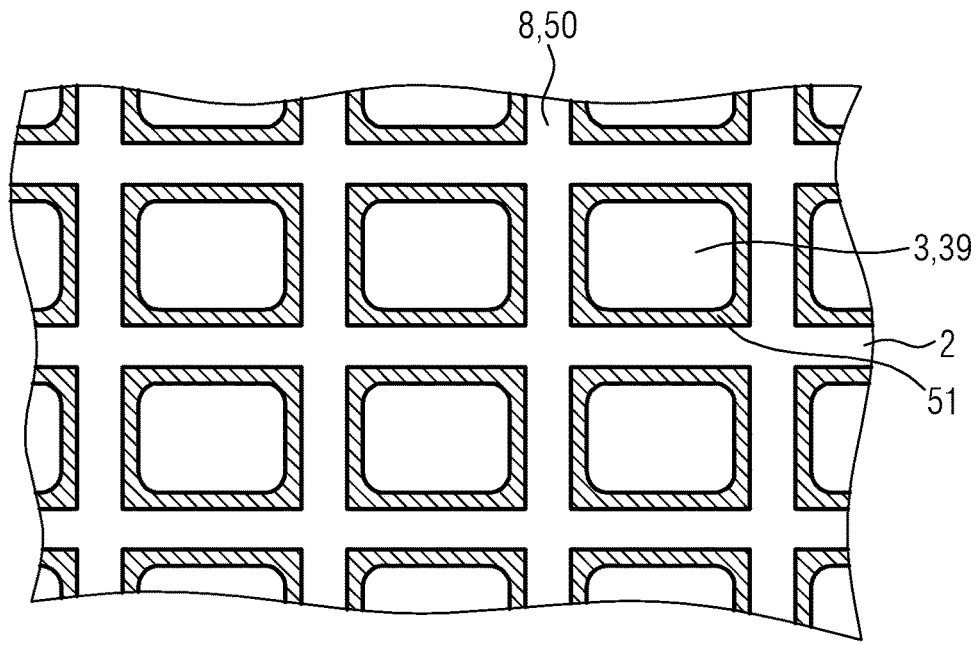
FIG. 9 shows a schematic top view of a method step of an exemplary embodiment of a production process for optoelectronic semiconductor chips described here.

In FIG. 9, a schematic top view of the semiconductor layer sequence 3 after singulation is shown, in particular as shown in the methods of FIGS. 6 and 7 as well as in the method of FIG. 8. That is, the singulation trenches 8 and the openings 50 run congruently. A corresponding structure with singulation trenches 8 narrower than the openings 50 can be used in the same way.

The intermixing regions 51 each run all around the sub-regions 39 of the semiconductor layer sequence 3 in a closed path. The sub-regions 39 for the semiconductor chips 1 are each approximately square or also rectangular in shape. Edge lengths of the sub-regions 39 are below 100 μm. A distance between adjacent sub-regions 39 and thus a width of the openings 50 and the singulation trenches 8 is preferably relatively small and is, for example, at most 10% or 5% or 2% of an average edge length of the sub-regions 39. In particular, the openings 50 and/or the singulation trenches 8 have a width of at most 5 μm or 3 μm or 1 μm and/or of at least 0.5 μm or 1 μm. In other words, the sub-regions 39 are arranged densely packed on the growth substrate 2, so that for diffusion of the intermixing auxiliary 55 comparatively little space remains.

Figure 10:
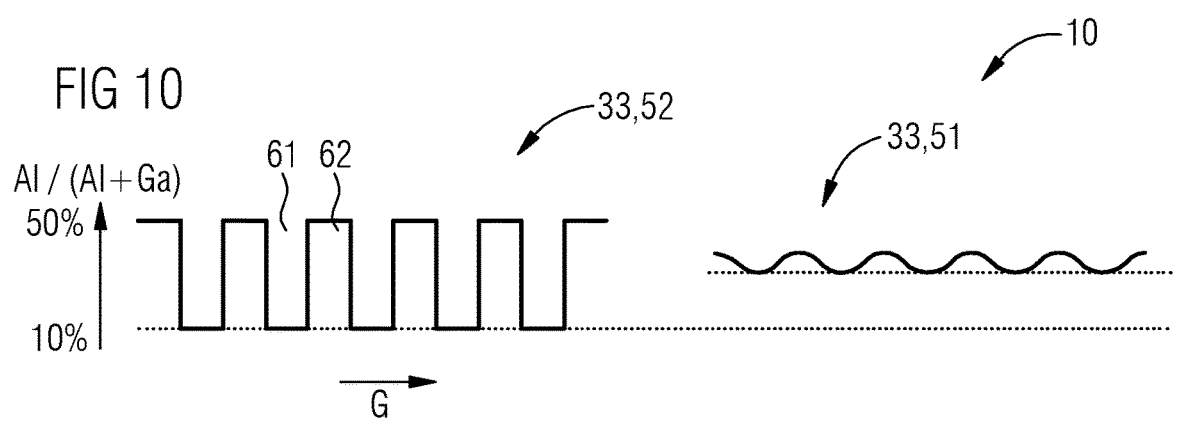
FIG. 10 shows a schematic illustration of a progression of an aluminum content in a modification of a semiconductor chip.

In FIG. 10 an illustration of a modification 10 of a semiconductor chip is shown. A ratio of an aluminum content to a sum of the aluminum content and a gallium content, specified as a percentage, is plotted over the growth direction G. The left-hand part of the figure refers to a semiconductor chip. The left part of the figure refers to a non-mixed region 52 of the active zone 33, whereas the right part of the figure refers to the intermixing region 51 of the active zone 33. The same illustration is also used in FIGS. 11 to 14.

The barrier layers 62 comprise a relatively low aluminum content. This results in a comparatively flat course of the aluminum content in the intermixing regions 51 after intermixing and thus a comparatively small increase in a band gap compared to the quantum well layers 61. This makes it relatively difficult to reduce recombination losses of charge carriers at the sidewalls of the sub-regions 39 and thus of the semiconductor chips 1. In conventional LEDs, such edge effects hardly play a role, since an edge line plays only a minor role relative to the total area of an active zone. In the μLEDs described herein, on the other hand, due to the small edge length of the sub-region 39, corresponding effects on the sidewalls are a potentially significant loss channel.

Figure 11:
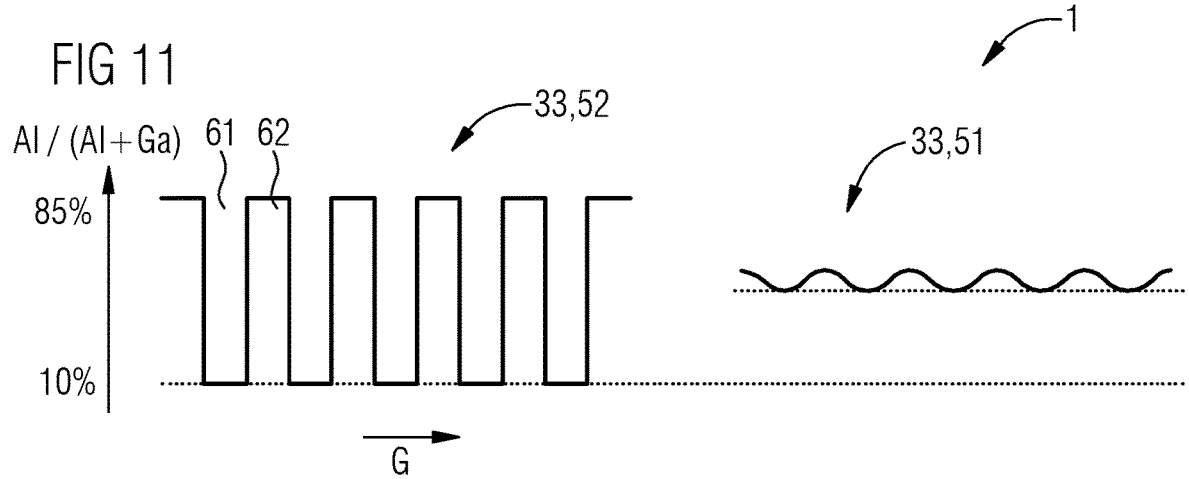
FIGS. 11-14 show schematic illustrations of aluminum gradients for exemplary embodiments of optoelectronic semiconductor chip described herein.

In FIG. 11 an illustration of the aluminum content for an exemplary embodiment of semiconductor chip 1 is shown. The barrier layers 62 comprise a significantly higher aluminum content of about 85% than in FIG. 10. This results in a significantly higher bandgap in the intermixing region 51 between the quantum well layers 61 in the unmixed region 52 and the intermixed structure in the intermixing region 51.

According to FIG. 11, all quantum well layers 51 and barrier layers 62 have the same growth and are thus present unchanged along the growth direction G in the immiscible region 52. In contrast, the barrier layers 62 according to FIGS. 12 to 14 each comprise at least one gradient with respect to thickness and/or material composition.

Figure 12:
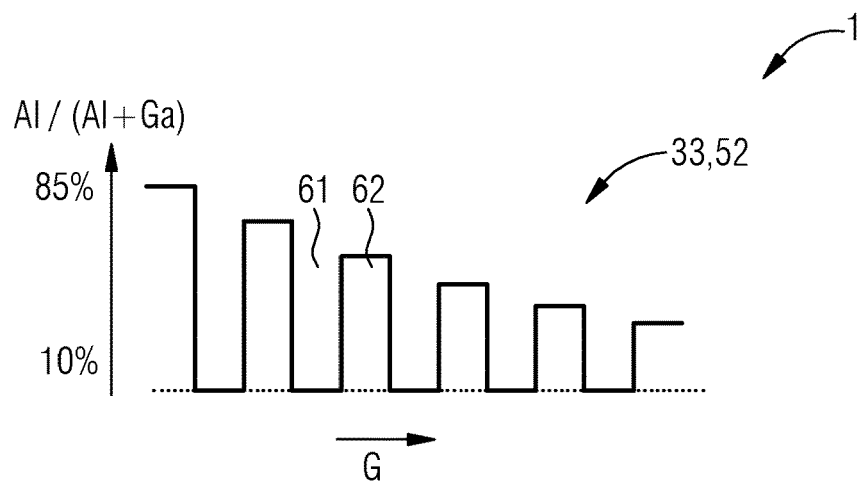

Thus, according to FIG. 12, the barrier layers 62 are designed along the growth direction G with a decreasing aluminum content. According to FIG. 13, the aluminum content of the barrier layers 62 is constant along the growth direction G, but a thickness of the barrier layers 62 decreases. FIG. 14 is a combination of the designs of FIGS. 12 and 13, such that along the growth direction G both the aluminum content decreases and a thickness of the barrier layers decreases.

In each of FIGS. 11 to 14, five quantum well layers 61 are shown only for simplicity of illustration. In each case, more or less than the quantum well layers shown may be present in the active zone 33.

Figure 13:
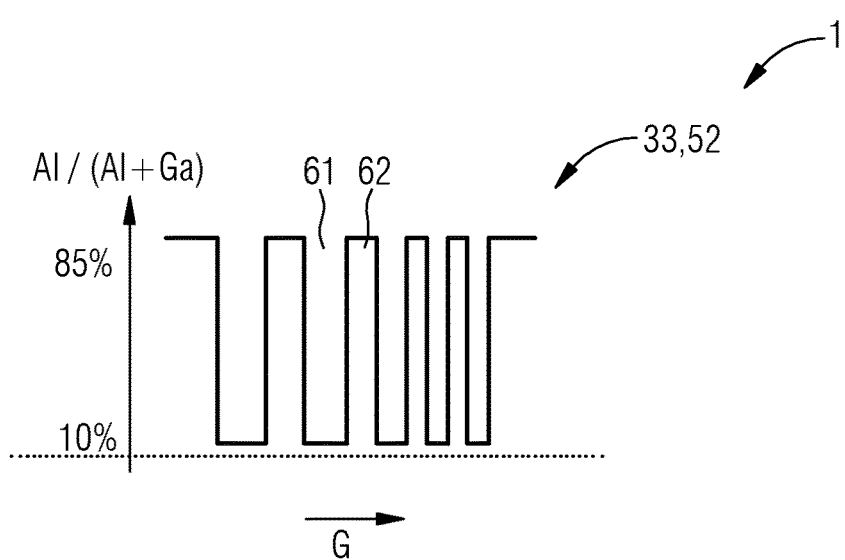
Figure 14:
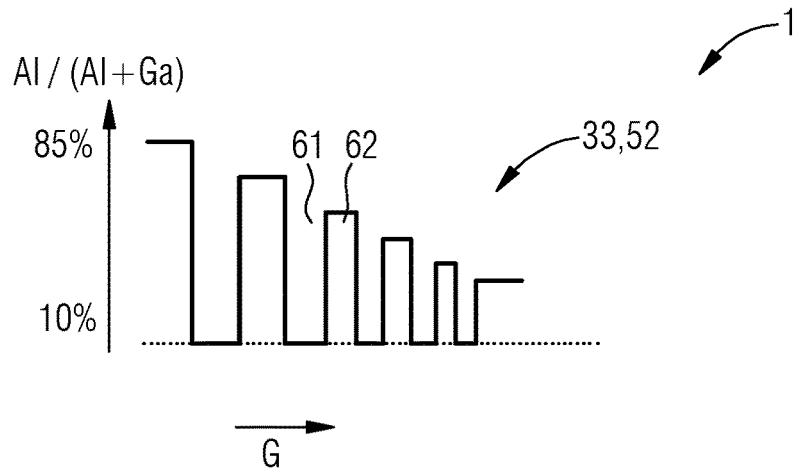

The barrier layers 62 of FIGS. 12 to 14 are arranged asymmetrically in the active zone 33, so that the active zone 33 does not comprise a plane of symmetry with respect to which the barrier layers 62 are mirror-symmetrically configured. Alternatively, symmetrical sequences of barrier layers 62 are also possible, so that, for example, analogous to FIG. 12, an aluminum content of the barrier layers 62 first increases along the growth direction G and then decreases to the same extent. The same applies to embodiments according to FIGS. 13 and 14.

Likewise, in deviation from the illustration of FIGS. 12 to 14, it is possible in each case for the growth direction G to run from right to left rather than from left to right. Furthermore, asymmetrical combinations of increasing and decreasing aluminum content and increasing and decreasing layer thickness and corresponding combinations thereof are possible in each case. This means that asymmetrically distributed barrier layers 62 with first increasing and then decreasing aluminum content or with first decreasing and then increasing aluminum content, as seen along the growth direction G, can be present. The same applies with regard to the thicknesses, compare FIG. 13, or for the combination of thickness variation and aluminum content variation, compare FIG. 14.

The components shown in the figures preferably follow each other directly in the sequence indicated, unless otherwise indicated. Layers not touching in the figures are preferably spaced apart. Insofar as lines are drawn parallel to one another, the corresponding surfaces are preferably likewise aligned parallel to one another. Likewise, the relative positions of the drawn components to each other are correctly reproduced in the figures, unless otherwise indicated.

The invention described herein is not limited by the description based on the exemplary embodiments. Rather, the invention encompasses any new feature as well as any combination of features, which particularly includes any combination of features in the patent claims, even if that feature or combination itself is not explicitly specified in the patent claims or exemplary embodiments.

The invention claimed is:

1. A method for producing optoelectronic semiconductor chips, the method comprising:
   A) growing an AlInGaAsP semiconductor layer sequence on a growth substrate along a growth direction, wherein the semiconductor layer sequence comprises an active zone for radiation generation, and wherein the active zone is composed of a plurality of alternating quantum well layers and barrier layers;
   B) generating a structured masking layer;
   C) regionally intermixing the quantum well layers and the barrier layers by applying an intermixing auxiliary through openings of the masking layer into the active zone in at least one intermixing region; and
   D) singulating the semiconductor layer sequence into sub-regions for the semiconductor chips, wherein the barrier layers in A) are grown from $[(Al_xGa_{1-x})_yIn_{1-y}]_zP_{1-z}$ with $x \geq 0.5$, wherein the quantum well layers are grown in A) from $[(Al_aGa_{1-a})_bIn_{1-b}]_cP_{1-c}$ with $0 < a \leq 0.2$,
   wherein the method is performed in the cited order, and
   wherein the at least one intermixing region is formed to comprise an indirect band gap such that radiating and non-radiating recombinations in the at least one intermixing region are reduced.

2. The method according to claim 1,
   wherein the masking layer is formed by a p-contact layer of the semiconductor layer sequence,
   wherein the p-contact layer is completely penetrated by the openings in B),
   wherein the p-contact layer comprises $Al_vGa_{1-v}As$ with $v \leq 0.35$,
   wherein intermixing in C) is performed along the growth direction completely through the active zone,
   wherein singulating in D) occurs only in the at least one intermixing region,
   wherein $0.47 \leq y \leq 0.53$ as well as $0.47 \leq z \leq 0.53$, and
   wherein $0.47 \leq b \leq 0.53$ as well as $0.47 \leq c \leq 0.53$.

3. The method according to claim 2,
   wherein the active zone is located between a first semiconductor region and a second semiconductor region and the p-contact layer is a sub-layer of the second semiconductor region which is located furthest away from the active zone after A), and
   wherein the openings extend at least 50 nm through the p-contact layer in a direction towards the active zone into a remaining second semiconductor region and terminate at a distance of at least 200 nm from the active zone.

4. The method according to claim 1, wherein the finished semiconductor chips are light-emitting diode chips, and wherein in D) each sub-region for the semiconductor chips comprises an average edge length of at most 100 μm.

5. The method according to claim 1, wherein, after D), the at least one intermixing region extends in a direction perpendicular to the growth direction at least 0.1 μm and at most 0.5 μm into the active zone.

6. The method according to claim 1, wherein the at least one intermixing region extends parallel to the growth direction completely through the semiconductor layer sequence.

7. The method according to claim 1,
   wherein between 3 and 30, inclusive, of the quantum well layers are present after A),
   wherein each quantum well layer comprises a thickness between 2 nm and 15 nm, inclusive,
   wherein each barrier layer comprises a thickness between 3 nm and 25 nm, inclusive, and
   wherein an emission wavelength of maximum intensity of the active zone is between 590 nm and 655 nm, inclusive.

8. The method according to claim 1,
   wherein, after A) and before C), at least some of the barrier layers comprise different aluminum contents,
   wherein, after A) and before C) within the respective barrier layer, the respective aluminum content is constant, and
   wherein a minimum and a maximum aluminum content of the barrier layers in the active zone differ by at least a factor of 1.1 and by at most a factor of 1.7.

9. The method according to claim 1,
   wherein at least some of the barrier layers comprise different thicknesses, and wherein a minimum thickness and a maximum thickness of the barrier layers in the active zone differ by at least a factor 1.5 and by at most a factor 6.

10. The method according to claim 1,
wherein the quantum well layers after A) and before C) are the same, and
wherein the barrier layers in the active zone are arranged asymmetrically with respect to a thickness variation and/or an aluminum content variation at least after A) until before C).

11. The method according to claim 1, wherein the intermixing auxiliary is zinc.

12. The method according to claim 11, wherein the intermixing auxiliary is applied in C) by a vapor phase deposition in form of diethylzinc and/or dimethylzinc.

13. The method according to claim 1, further comprising, after D), in E), applying a passivation layer to a cut through intermixing regions.

14. The method according to claim 1, further comprising removing the growth substrate after C).

15. An optoelectronic semiconductor chip comprising:
an AlInGaAsP semiconductor layer sequence,
wherein the semiconductor layer sequence comprises an active zone configured to generate radiation, the active zone being composed of a plurality of alternating quantum well layers and barrier layers,
wherein the semiconductor layer sequence comprises a structured masking layer,
wherein the quantum well layers and the barrier layers are regionally intermixed in the active zone in an intermixing region and an intermixing auxiliary is present in the intermixing region,
wherein the barrier layers outside the intermixing region comprise $[(Al_xGa_{1-x})_yIn_{1-y}]_zP_{1-z}$ with $x \geq 0.5$, and the quantum well layers outside the intermixing region comprise $[(Al_aGa_{1-a})_bIn_{1-b}]_cP_{1-c}$ with $0 < a \leq 0.2$, and
wherein the at least one intermixing region comprises an indirect band gap such that radiating and non-radiating recombinations in the at least one intermixing region are reduceable.

16. The optoelectronic semiconductor chip according to claim 15, wherein the optoelectronic semiconductor chip is a light emitting diode chip with an emission wavelength of maximum intensity between 560 nm and 670 nm, inclusive, with an average edge length of at most 50 μm, and wherein the intermixing region extends in a direction perpendicular to a growth direction of the semiconductor layer sequence at least 0.1 μm and at most 0.5 μm into the active zone.

* * * * *